United States Patent [19]

Tepman

[11] Patent Number: 5,566,744
[45] Date of Patent: Oct. 22, 1996

[54] APPARATUS AND METHOD TO ENSURE HEAT TRANSFER TO AND FROM AN ENTIRE SUBSTRATE DURING SEMICONDUCTOR PROCESSING

[75] Inventor: Avi Tepman, Cupertino, Calif.

[73] Assignee: Applied Materials, Inc., Santa Clara, Calif.

[21] Appl. No.: 570,803

[22] Filed: Dec. 12, 1995

Related U.S. Application Data

[63] Continuation of Ser. No. 300,274, Sep. 2, 1994, abandoned, which is a continuation of Ser. No. 58,855, May 5, 1993, Pat. No. 5,366,002.

[51] Int. Cl.⁶ .................................................. H01L 21/00
[52] U.S. Cl. ...................... 165/80.1; 165/185; 118/724; 118/728
[58] Field of Search ................ 165/1, 80.1, 80.2, 165/80.4, 185; 118/724, 725, 728; 411/501, 512, 907

[56] References Cited

U.S. PATENT DOCUMENTS

| | | | |
|---|---|---|---|
| 2,405,897 | 8/1946 | Milone | 411/501 |
| 2,439,516 | 4/1948 | Holcomb | 411/907 X |
| 3,095,777 | 7/1963 | Hallack | 411/501 |
| 3,829,150 | 8/1974 | Moore | 411/907 X |
| 4,709,655 | 12/1987 | Van Mastrigt | 118/719 |
| 4,724,621 | 2/1988 | Hobson et al. | 34/218 |
| 4,842,683 | 6/1989 | Cheng et al. | 156/345 |
| 4,892,753 | 1/1990 | Wang et al. | 570/255 |
| 5,199,483 | 4/1993 | Bahng | 165/1 |

FOREIGN PATENT DOCUMENTS 0250064 12/1987 European Pat. Off. .

*Primary Examiner*—Allen J. Flanigan
*Attorney, Agent, or Firm*—Shirley L. Church; Donald J. Verplancken

[57] ABSTRACT

The apparatus and method of the present invention provide even and repeatable heat transfer to and from essentially the entire substrate used in semiconductor processing. In particular, the support platform upon which the substrate sets during processing is designed to permit heat transfer to the very edge of the substrate so that substrate space unavailable for processing is minimized.

The support platform comprises a substrate-facing surface 211 including at least one fluid supply source 214; a continuous, platform-based fluid flow barrier 212; and at least one opening 234 through substrate-facing surface 211 through which a substrate lift finger 221 can be operated. Fluid flow barrier 212 contacts the back side (non-processed side) of the substrate at a location very near the exterior edge of the substrate.

To prevent heat transfer fluid from flowing downward through the lift finger openings 234, a lift finger sealing cover 222 is employed. Sealing cover 222 is preferably self-aligning, to ensure formation of a continuous lift finger fluid flow barrier 228 surrounding lift finger opening 234.

14 Claims, 2 Drawing Sheets

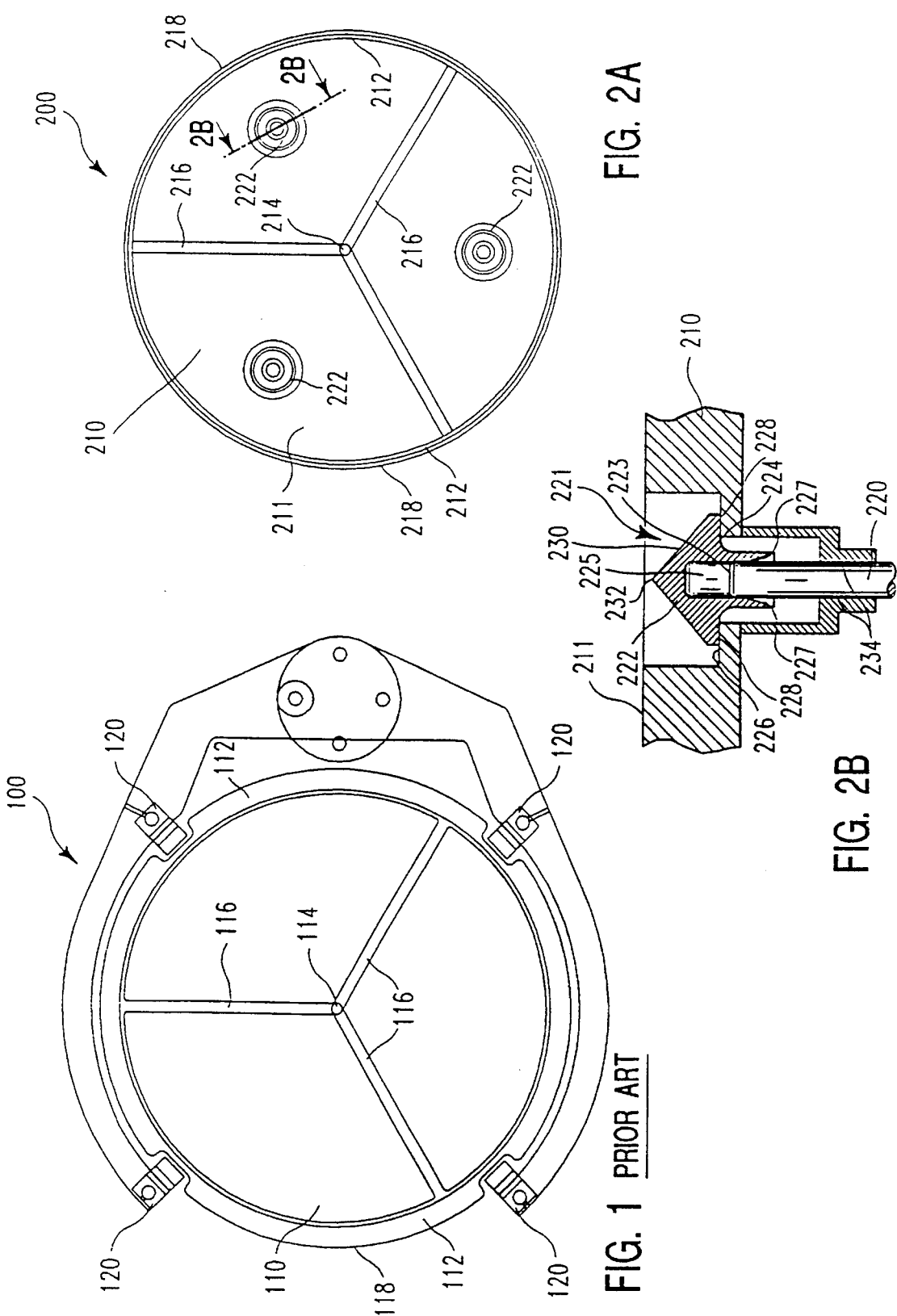

APPARATUS AND METHOD TO ENSURE HEAT TRANSFER TO AND FROM AN ENTIRE SUBSTRATE DURING SEMICONDUCTOR PROCESSING

This application is a Continuation of prior U.S. application Ser. No. 08/300,274, filed Sep. 2, 1994, now abandoned, which was a continuation application of prior U.S. application Ser. No. 08/058,855 filed May 5, 1993 which issued as U.S. Pat. No. 5,366,002.

BACKGROUND OF THE INVENTION

1. Field of the Invention

The present invention pertains to an apparatus and method which ensure substantially even and repeatable heat transfer to and from the entire substrate used in semiconductor processing. In particular, the platform upon which the substrate sets during processing is designed to permit heat transfer to the very edge of the substrate so that minimal substrate surface space is unavailable for processing.

2. Description of the Background Art

In the manufacture of many electronic or electrical components such as integrated circuits, there is a need to deposit thin films on substrates. Materials such as, for example, aluminum, titanium, tungsten, tantalum, tantalum nitride, cobalt, and silica may be deposited on ceramic, glass or silicon-derived substrates using physical vapor deposition (PVD) processes such as a sputtering process. Another method of deposition of solid materials upon a substrate is chemical vapor deposition (CVD), wherein a solid material is deposited from a gaseous phase onto a substrate by means of a chemical reaction. The deposition reaction involved is generally thermal decomposition, chemical oxidation, or chemical reduction. The CVD process can be used to deposit many elements and alloys as well as compounds including oxides, nitrides and carbides.

The thin film deposited is subsequently etched or otherwise fabricated into the circuits and/or components.

In a typical PVD process, such as sputtering, a low pressure atmosphere of an ionizable gas such as argon or helium is produced in a vacuum chamber. The pressure in the vacuum chamber is reduced to about $10^{-6}$ to $10^{-10}$ Torr, after which argon, for example, is introduced to produce an argon partial pressure ranging between about 0.0001 Torr (0.1 mTorr) and about 0.020 Torr (20 mTorr). Two electrodes, a cathode and an anode, are generally disposed in the vacuum chamber. The cathode is typically made of the material to be deposited or sputtered, and the anode is generally formed by the enclosure (particular walls of the vacuum chamber, or the platform upon which the substrate sits, for example). At times, an auxiliary anode may be used or the article to be coated may serve as the anode. Typically a high voltage is applied between these two electrodes, and the substrate to be coated is disposed upon a platform positioned opposite the cathode. The platform upon which the substrate sets is often heated and/or cooled, and heat is transferred between 8 the platform and the substrate, to assist in obtaining the desired coating upon the substrate. The coating is a thin film which needs to have an even thickness, controlled stress and the desired material morphology, while providing step coverage. To obtain such a thin film coating, it is desirable to maintain the substrate at a uniform temperature within a few °C.; preferably, the temperature is near but below the melting point of the material from which the film is being formed. It is very important that the substrate temperature be repeatable each time a given process is carried out. Thus, the heat transfer between the platform and the substrate must be uniform and repeatable.

In a typical CVD process, to facilitate uniformity of deposition coverage of the substrate, the deposition is carried out in a vacuum chamber under a partial vacuum. The pressure in the CVD chamber commonly ranges between about 0.070 Torr (for plasma enhanced CVD) to about 200 Torr (for "high pressure" CVD). As reactive gases are fed into the chamber, they are directed via pressure differential (created by the vacuum system applied to the CVD chamber) across the surface of the substrate to be coated, in a manner which provides an even flow of reactants over the substrate surface. The deposition is also controlled by the temperature of the surfaces which contact the reactant gases. Thus, it is critical that the substrate surface be controlled at a desired uniform temperature.

The platform upon which the substrate sets is commonly used as the means for transferring heat to and from the substrate. Radiant, inductive, or resistance heating is commonly used to heat a support platform; it is also possible to circulate a heat transfer fluid internal to the support platform to provide heating or cooling of the support platform.

When the pressure in the process (vacuum) chamber is about 5 Torr or less, convective/conductive heat transfer between the substrate and the platform becomes impractical. Since the substrate and the platform typically do not have the perfectly level surfaces which would enable sufficiently even heat transfer by direct conduction, it is helpful to provide a heat transfer fluid between the platform and the substrate, to assist in providing even heat transfer between the support platform and the substrate. Preferably the heat transfer fluid used between the substrate and its support platform is in constant movement (flowing) to provide yet another improvement in the uniformity of the heat transfer. The heat transfer fluid commonly used between the support platform and the substrate is one of the gases used in the sputtering, CVD or etch process.

A frequently-used substrate support platform design is one having a substrate contact surface which is principally flat-faced with openings and/or exposed channels spaced at various locations upon this surface. The fluid used to transfer heat between the platform and the substrate flows through the openings or is fed through an opening into exposed channels in the flat-faced surface of the platform. The heat transfer fluid can be provided to the platform from a fluid supply source via tubing which connects the fluid supply source to the platform. The platform itself may include various means for directing fluid to the openings and/or exposed channels in the surface of the platform.

In operation of a semiconductor processing apparatus, the substrate to be processed is typically mechanically or electrostatically clamped along its edges to the substrate-facing surface of the support platform. The fluid used to transfer heat between the support platform and the substrate is typically a gas such as helium, argon, hydrogen, carbon tetrafluoride, or hexafluoroethane, for example, or other suitable gas that is a good heat conductor at low pressure. This heat transfer fluid is applied through openings or supplied into exposed channels in the substrate-facing surface of the support platform. Presence of the heat transfer fluid between the substrate and support platform surface establishes a nearly static gas pressure which commonly ranges from about 1 Torr to about 100 Torr, depending on the particular film deposition/etch process. It is preferable that the pressure between the substrate and its support platform be designed to exceed the overall pressure in the process chamber so that a minor, constant net flow of fluid from beneath the substrate into the process (vacuum) chamber occurs. This helps avoid contamination of the support platform and fluid supply system.

The positive pressure between the back (non-processed) side of the substrate and its support platform, as described above, tends to bow a thin substrate which is mechanically clamped at its edge. Bowing of the substrate reduces the amount of heat transfer near the center of the substrate and results in uneven heating of the substrate in general.

Once the processing steps have been completed and it is desired to remove the semiconductor-processed substrate from the support platform, the clamping means is released and lift fingers are used to raise the semiconductor-processed substrate above the support platform so that handling means can grasp it and move it away from the support platform. These lift fingers have been placed exterior to the substrate support platform so the fluid flowing across the back side of the substrate and across the support platform will not flow down an opening through which a lift finger is operated, but will flow with even distribution across the substrate support platform.

The combination of the support platform, clamping means and externally-located lift fingers (as described above) has the disadvantage that the edge of the substrate, which constantly loses heat due to radiation, does not receive adequate heat input from the support platform. The uneven heat transfer gas pressure at the exterior edges of the substrate results in a substrate which is colder around its exterior edge, so that this portion of the substrate cannot be used for semiconductor device construction. Due to the importance of using all of the "real estate" surface of the substrate, it would be highly desirable to provide even heating of the semiconductor substrate to the very edge of the substrate.

SUMMARY OF THE INVENTION

In accordance with the present invention, an apparatus useful in semiconductor processing of substrates is provided; the apparatus enables uniform and repeatable heat transfer to the very edge of a substrate so that substrate surface space available for processing is maximized. The apparatus comprises a substrate support platform used in combination with lift fingers.

The support platform comprises a substrate-facing surface having at least one opening through which a heat transfer fluid can be supplied to the substrate-facing surface; a continuous, platform fluid flow barrier which is positioned upon the substrate-facing surface so that contact between the continuous platform fluid flow barrier and a substrate placed on the support platform occurs at a location very near the edge of the substrate; and, openings through which lift fingers can be operated. The lift finger openings are positioned at a location interior to and enclosed by the continuous platform fluid flow barrier.

The preferred embodiment lift finger comprises a lift finger pin and a lift finger sealing cover. During semiconductor processing operations, when a heat transfer fluid is flowing over the substrate-facing surface of the support platform, the lift finger sealing cover reaches from the top of the lift finger pin to a contact surface located upon or within the support platform, to form a lift finger fluid flow barrier which prevents the heat transfer fluid from flowing through the lift finger opening.

The lift finger sealing cover is preferably a replaceable cap which sets upon and extends down over the lift finger pin. The lift-finger cap sets upon the lift finger pin in a manner such that height of the lift finger cap uppermost surface above the top of the lift finger pin and the angle between the lift finger cap vertical axis and the lift finger pin vertical longitudinal axis are self-adjustable. This self-adjustability of the height and angle of the lift finger cap relative to the lift finger pin permits improved performance of the lift finger fluid flow barrier, by improving the amount of contact surface (sealing surface) between the lift finger sealing cover and the support platform surface which it contacts.

When a mechanical or electrostatic clamping means is used to hold the substrate in position on the support platform, it is preferable that the clamping means be applied directly above the continuous, platform fluid flow barrier located very near the edge of the substrate, in a manner that pressure is evenly applied on the substrate surface, whereby even contact pressure is provided between the substrate back side and the continuous fluid flow barrier.

Also in accordance with the present invention, a method is provided which enables uniform and repeatable heat transfer between a substrate undergoing semiconductor processing and a support platform on which the substrate sets. The method comprises the steps of:

a) providing a support platform upon which a substrate to be processed is positioned;

b) attaching the substrate to the support platform;

c) causing a heat transfer fluid to flow between the substrate and the support platform;

d) controlling the flow of heat transfer fluid between the substrate and the support platform using a continuous, platform fluid flow barrier located near the edge of the substrate, wherein the platform fluid flow barrier is in contact with both the support platform and the substrate to be processed;

e) locating lift fingers, which can be used to raise and lower the substrate upon the support platform, interior to the continuous, platform fluid flow barrier; and f) providing a means for preventing flow of the heat transfer fluid through openings in the support platform through which the lift fingers are operated, wherein the means for preventing the heat transfer fluid flow through a lift finger opening comprises a lift finger sealing cover which contacts a surface upon the support platform in a manner which creates a barrier to the flow of fluid through the lift finger opening.

BRIEF DESCRIPTION OF THE DRAWINGS

FIG. 1 shows a schematic top view of a semiconductor processing apparatus 100, including a substrate support platform 110 and lift fingers 120 of a kind used prior to the present invention.

FIG. 2A shows a schematic top view of a preferred embodiment of the present invention semiconductor processing apparatus 200, including a substrate support platform 210 and lift fingers comprising lift finger pins 220 (hidden from view) and lift finger sealing covers 222.

FIG. 2B shows a schematic side view of a portion of platform 210, and lift finger 221, including a lift finger pin 220 and lift finger sealing cover 222.

DETAILED DESCRIPTION OF THE PREFERRED EMBODIMENT

Figure 3:
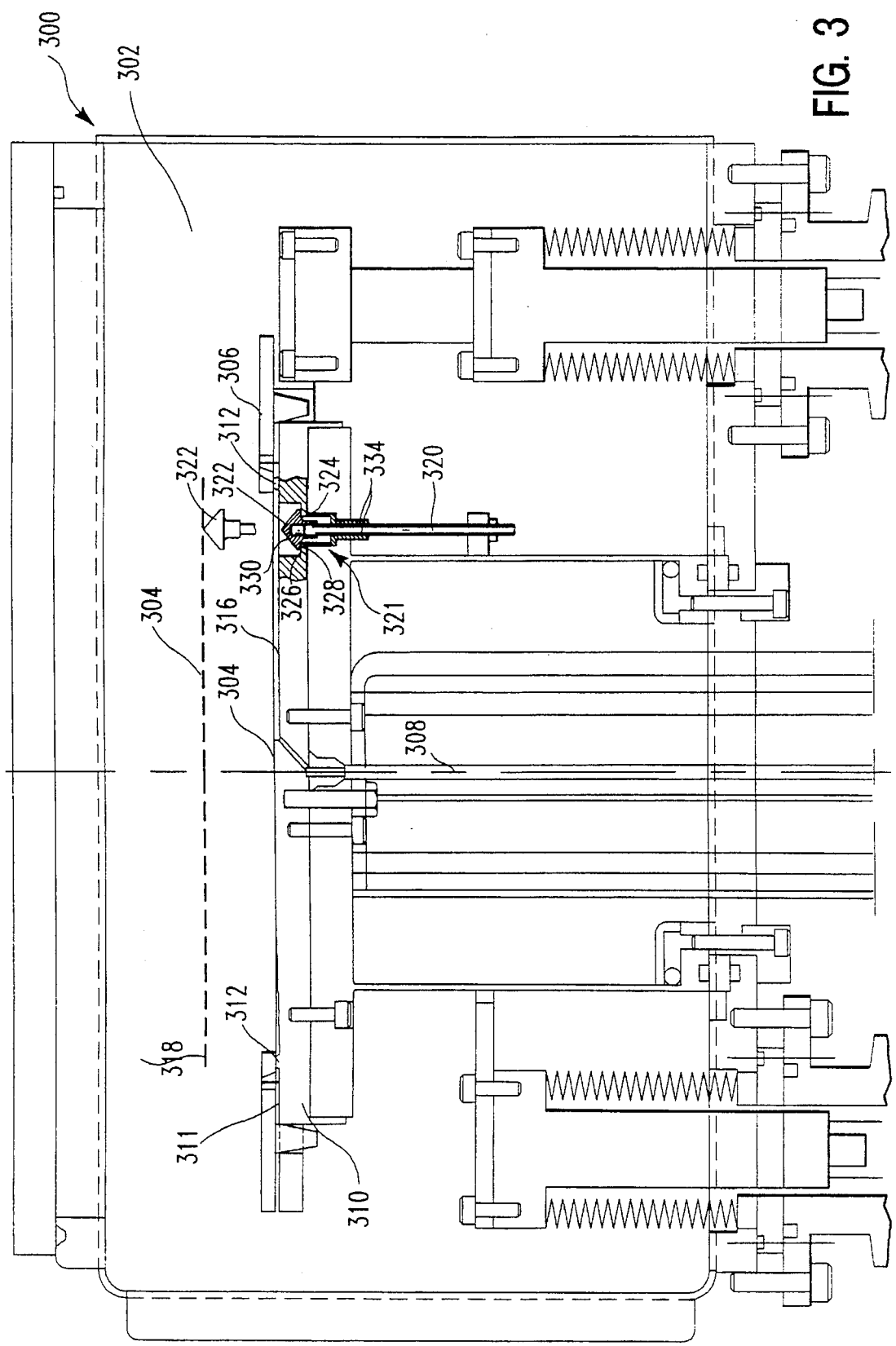
FIG. 3 illustrates a schematic side view of a semiconductor processing apparatus 300 wherein a substrate support platform 310 works in conjunction with lift finger 321 which is located interior to continuous platform fluid flow barrier 312.

The present invention relates to an apparatus and method useful in semiconductor processing which ensure uniform and repeatable heat transfer to the edge of a substrate. The present invention increases the amount of substrate surface which is usable for semiconductor processing.

The invention particularly pertains to a substrate support platform upon which the substrate is positioned during processing and to lift fingers which are used to raise the substrate from the support platform when processing is complete, making the substrate more accessible to a robot arm used to remove the substrate from the process chamber.

As discussed in the Background Art description above, the substrate support platform is typically used to transfer heat to and from the substrate to be processed. Due to the heat transfer problems encountered in a partial vacuum, a fluid is used to assist in the transfer of heat between the back (unprocessed) side of the substrate and the substrate support platform.

FIG. 1 shows a schematic top view of a prior art semiconductor processing apparatus 100, including a substrate support platform 110. Support platform 110 comprises an opening 114 through which a fluid can enter, and exposed channels 116 which assist in the distribution of fluid over the surface of support platform 110. In this particular instance, support platform 110 is round, although the support platform may be another shape, such as rectangular.

When semiconductor processing apparatus 100 is in operation, a substrate (not shown) sets upon the surface of substrate support platform 110. A heat transfer fluid enters support platform 110 through opening 114, is directed across the surface of support platform 110 by opening channels 116 and eventually builds up a pressure between the substrate and support platform 110. A minor amount of heat transfer fluid leaks across the exterior lip 112 of support platform 110, to enter the process chamber (not shown). Lift fingers 120 are located exterior to lip 112 of support platform 110. Although open channels 116 help to provide a more even fluid flow pattern between the substrate (not shown) and the surface of support platform 110, substrate bowing occurs and an excessive amount of heat transfer fluid leaks across exterior lip 112 in the areas adjacent lip fingers 120. As a result of uneven fluid flow patterns and uneven heating of the substrate occurs.

FIG. 2A shows a schematic top view of a present invention preferred embodiment, processing apparatus 200. Substrate support platform 210 comprises a substrate-facing surface 211; a continuous platform fluid flow barrier 212; an opening 214 through which a fluid can enter; and exposed channels 216 which assist in the distribution of fluid over substrate-facing surface 211 of support platform 210. As previously discussed, the support platform is round although platforms of other shapes can also be used. Further, the distribution of fluid over substrate-facing surface 211 can be obtained using flow directing means other than open channels.

Continuous platform fluid-flow barrier 212 is located very near the edge 218 of support platform 210, since lift fingers 221 (there are typically three of the kind shown in FIG. 2B) are located interior to continuous platform fluid flow barrier 212 and exterior lift fingers do not have to be accommodated. However, prior to the present invention, locating lift fingers interior to a continuous, platform fluid flow barrier created a source of non-uniform fluid flow across the support platform. The heat transfer fluid built up pressure across the surface of the support platform and leaked through the space between the lift finger and the opening through which the lift finger was extended and retracted. For example, with reference to FIG. 2B, if lift finger sealing cover 222 were not present, fluid flowing over substrate-facing surface 211 of support platform 210 would be able to pass through opening 234 surrounding lift finger pin 220. To prevent fluid from exiting through the space between lift finger pin 220 and opening 234, a lift finger sealing cover 222 was developed.

During the semiconductor processing operations, the pressure in the process (vacuum) chamber surrounding the substrate and the substrate support platform 210 is a partial vacuum, as previously described. The gas pressure between the substrate and the substrate support platform 210 is greater than that of the chamber pressure, due to the pressure of the heat-transfer fluid which is pumped between the back (nonprocessed) substrate surface and support platform 210. The heat-transfer fluid is permitted to leak at a controlled rate across continuous, platform fluid flow barrier 212 located on the surface of the support platform 210 and would also flow downward from the substrate-facing surface 211 of support platform 210 through opening 234. To prevent fluid from flowing through opening 234, it was necessary to provide a lift finger fluid flow barrier. Lift finger sealing cover 222 provides such a fluid flow barrier. Contact surface 228 between the lower surface 224 of lift finger sealing cover 222 and the recessed upper surface 226 of support platform 210 provides a barrier to the flow of fluids through opening 234. The positive pressure of the heat-transfer fluid on surface 230 forces lift finger sealing cover 222 downward, assisting the fluid flow barrier provided at contact surface 228. When processing is completed, the flow of fluids within the process chamber is discontinued, pressure within the chamber is equalized and the substrate holding (clamping) means is released. The substrate can then be lifted above support platform 210, by extension of lift finger 220 above the surface of substrate platform 210 and above vertical fluid flow barrier 212.

When a substrate is positioned on support platform 210, as it is during processing, lift finger 221 is retracted and the lower surface 224 of lift finger sealing cover 222 is in contact with a surface on support platform 210, such as upper recessed surface 226. Thus, during processing operations, lift finger sealing cover 222 reaches from the top of lift finger pin 220 support platform 210 surface 226 to form a contact surface 228. In the embodiment shown in FIG. 2B, contact surface 228 is a recessed surface within the wall of support platform 210, and the uppermost surface 232 of lift finger sealing cover 222 sets beneath substrate-facing surface 211 of support platform 210. In any case, the uppermost surface 232 of lift finger sealing cover 222 must be positioned at or beneath the height of continuous platform fluid flow barrier 212, which typically rise only about 0.001 to about 0.003 inches (about 0.25 mm to about 0.008 mm) above substrate-facing surface 211.

In the preferred embodiment shown in FIG. 2B, lift finger 221 is comprised of lift finger sealing cover 222, an individual, replaceable cap which sets upon a post-shaped lift finger pin 220. Although it would be possible for lift finger 221 to be a single molded or machined element, this kind of lift finger would not be self-adjusting and would provide inferior performance as a fluid flow barrier. Typically at least 3 lift fingers are used in conjunction to raise a substrate above support platform 210; the lift fingers should provide a level, horizontal support surface for the substrate. Further, each lift finger 221 must contact the support platform in a manner to provide a sealing contact surface 228 which prevents fluid from exiting through opening 234. It would be very time consuming and expensive to precision align each lift finger with support platform 210 and, in particular, with the upper contact surface 226 of support platform 210.

The upper surface 223 of lift finger pin 220 extends into a hollow space 225 in lift finger sealing cover 222 to the extent necessary so that the surface provided by a combination of lift fingers is self-aligning; that is, the lift finger surfaces provide a level, horizontal surface on which a substrate can be lifted. The amount of extension of pin 220 into space 225 can be self-adjusted by the weight of the substrate pressing on the combination of lift fingers. The replaceable cap design of lift finger sealing cover 222 shown in FIG. 2B is also self-aligning in terms of providing a continuous sealing contact surface 228. The taper of inner surface 227 of lift finger sealing cover 222 extends above the upper surface 223 of lift finger pin 220. This permits the vertical centerline of lift finger sealing cover 222 to adjust relative to the vertical, longitudinal centerline of lift finger pin 220, providing a self-aligning feature at contact surface 228 where undersurface 224 of lift finger sealing cover 222 contacts upper recessed surface 226 of support platform 210. The pressure of heat transfer fluid upon surface 230 of lift finger sealing cover 222 assists in the self-alignment of undersurface 224 with upper recessed surface 226, while increasing the fluid flow barrier strength at contact surface 228.

In the preferred embodiment shown in FIG. 2B, lift finger sealing cover 222 is cone-shaped. Other shapes, such as a mushroom shape, can be used for the finger sealing cover as well, provided the uppermost surface 232 of lift finger sealing cover 222 provides a stable support contact with a substrate, and provided an adequate contact surface 228 is obtained between undersurface 224 of lift finger sealing cover 222 and upper recessed surface 226 of substrate platform 210, whereby the necessary fluid flow barrier is created.

FIG. 3 shows a schematic side view of a semiconductor processing apparatus 300 and provides information as to the location of the apparatus of the present information relative to a semiconductor processing chamber 302 in general.

A substrate 304 to be processed is positioned on substrate platform 310. Substrate 304 is held in position during processing by a clamping mechanism 306 which is applied to the edge of substrate 304. Substrate 304 can be selected from a variety of substrates such as silicon, glass and lithium niobate, for example.

A heat transfer fluid is fed to substrate-facing surface 311 of substrate support platform 310 through fluid transfer conduit 308 which is connected to a fluid outlet on the surface of substrate-facing surface 311. In the embodiment shown in FIG. 3, the fluid flows into an exposed channel 316.

A continuous, platform fluid flow barrier 312 is located on substrate-facing surface 311 in a manner so that it will be near the edge 318 of substrate 304.

Lift finger 321 (typically at least three lift fingers per support platform) is used to raise substrate 304 above the surface of support platform 310 once processing is complete. Lift finger 321 is extended and retracted relative to substrate-facing surface 311 of support platform 310 by movement of lift finger pin 220 through opening 334.

To prevent fluid from flowing out opening 334 during processing of substrate 304, lift finger sealing cover 322 creates a lift finger fluid flow barrier 328. As previously described, contact surface 328 between the under surface 324 of sealing cover 322 and the upper recessed surface 326 of support platform 310 acts as a fluid flow barrier.

The above-described preferred embodiments of the present invention are not intended to limit the scope of the present invention as demonstrated by the claims which follow, as one skilled in the art can, with minimal experimentation, extend the disclosed concepts of the invention to the claimed scope of the invention.

What claimed is:

1. An apparatus useful in semiconductor processing of substrates, said apparatus comprising:
   a) a substrate support platform having a substrate-facing surface, said substrate-facing surface comprising:
      1) at least one fluid supply means, whereby a heat transfer fluid can be supplied to said substrate-facing surface;
      2) a continuous, platform fluid flow barrier which extends upward from said substrate-facing surface such that continuous contact occurs between said platform fluid flow barrier and a substrate placed on said support platform;
      3) at least one lift finger opening through said substrate-facing surface, through which a substrate lift finger can be operated; and
   b) at least one lift finger which can be extended upward from said substrate-facing surface of said support platform and which is positioned to operate through said lift finger opening, wherein said lift finger comprises:
      1) a lift finger pin member; and
      2) a lift finger sealing cover which extends from said lift finger pin member to a contact surface on said support platform during semiconductor processing, whereby a lift finger fluid flow barrier is formed by said contact surface between said lift finger sealing cover and said support platform surface so that a heat transfer fluid supplied to said substrate-facing surface does not flow through said lift finger opening, whereby an area on said substrate support platform bounded by said platform fluid flow barrier can extend in a manner which encompasses said at least one lift finger.

2. The apparatus of claim 1, wherein said lift finger sealing cover is an individual component which sets upon the upper surface of said lift finger pin member.

3. The apparatus of claim 2, wherein said lift finger sealing cover functions in combination with said lift finger pin member in a manner which is self-adjusting so that several lift fingers operating together form an essentially level, horizontal support for a substrate.

4. The apparatus of claim 1, wherein said lift finger sealing cover functions in combination with said lift finger pin member in a manner which is self-adjusting so that said lift finger fluid flow barrier is continuous surrounding said lift finger opening.

5. A lift finger useful in combination with a substrate support platform used in the processing of semiconductor substrates, comprising:
   a) a lift finger pin member having a smooth outer surface; and
   b) a lift finger sealing cover which is slidably disposed upon said lift finger pin member, wherein an upper surface of said lift finger sealing cover is capable of contacting a substrate to be processed, and a lower surface of said lift finger sealing cover is capable of making contact with a surface on an underlying support platform during semiconductor processing, and wherein said lift finger sealing cover functions in combination with said lift finger pin member in a manner which is self-adjusting, whereby a continuous contact with said underlying support platform is ensured.

6. The lift finger of claim 5, wherein said lift finger sealing cover is an individual component which sets upon the upper surface of said lift finger pin member.

7. The lift finger of claim 6, wherein said lift finger sealing cover functions in combination with said lift finger pin member in a manner which is self-adjusting so that several lift fingers operating together form an essentially level, horizontal support for a substrate.

8. The lift finger of claim 5, wherein said lift finger sealing cover is cone-shaped.

9. The lift finger of claim 5, wherein said lift finger sealing cover is mushroom-shaped.

10. The lift finger of claim 5, wherein said lift finger sealing cover is pushed downward upon application of a fluid to said upper surface of said lift finger sealing cover.

11. The lift finger of claim 10, wherein said lift finger sealing cover is self-adjusted by said downward pressure so that said lower surface of said lift finger sealing cover is capable of forming a continuous contact with the surface of an underlying support platform in a manner which provides a continuous fluid flow barrier surrounding said lift finger pin member.

12. A method useful in obtaining even and repeatable heat transfer over essentially an entire substrate used in a semiconductor process, said method comprising the steps of:

a) providing a support platform upon which a substrate to be processed is positioned;

b) attaching said substrate to said support platform;

c) causing a build up of heat transfer fluid between said substrate and said support platform;

d) controlling the leakage of heat transfer fluid from between said substrate and said support platform using a continuous, platform fluid flow barrier, wherein said platform fluid flow barrier is in continuous contact with both said support platform and said substrate to be processed; and, e) providing a means for preventing fluid flow through at least one opening on the surface in said support platform through which at least one lift finger is operated, wherein said means for preventing flow of said heat transfer fluid through said lift finger opening comprises a lift finger sealing cover which contacts a surface upon said support platform in a manner which creates a barrier to the flow of fluid through said at least one lift finger opening.

13. The method of claim 12, wherein said lift finger sealing cover is pushed downward toward said support platform by the heat transfer fluid between said substrate and said support platform.

14. The method of claim 13, wherein said lift finger sealing cover is self-adjusted by said downward pressure so that said lift finger sealing cover forms a continuous contact with the surface of said support platform in a manner which provides a continuous fluid flow barrier surrounding said lift finger opening.

* * * * *